United States Patent
Ankoudinov et al.

(10) Patent No.: US 8,598,620 B2
(45) Date of Patent: Dec. 3, 2013

(54) MOSFET WITH INTEGRATED FIELD EFFECT RECTIFIER

(75) Inventors: Alexei Ankoudinov, Redmond, WA (US); Vladimir Rodov, Seattle, WA (US); Richard Cordell, Boulder Creek, CA (US)

(73) Assignee: STMicroelectronics N.V., Amsterdam (NL)

( * ) Notice: Subject to any disclaimer, the term of this patent is extended or adjusted under 35 U.S.C. 154(b) by 241 days.

(21) Appl. No.: 12/431,580

(22) Filed: Apr. 28, 2009

(65) Prior Publication Data

US 2009/0267111 A1  Oct. 29, 2009

Related U.S. Application Data

(63) Continuation of application No. 12/238,308, filed on Sep. 25, 2008, now Pat. No. 8,148,748, and a continuation of application No. 12/359,094, filed on Jan. 23, 2009, now Pat. No. 8,421,118.

(60) Provisional application No. 60/975,467, filed on Sep. 26, 2007, provisional application No. 61/022,968, filed on Jan. 23, 2008, provisional application No. 61/048,336, filed on Apr. 28, 2008.

(51) Int. Cl.
  *H01L 29/66* (2006.01)
  *H01L 29/74* (2006.01)

(52) U.S. Cl.
  USPC ........ 257/124; 257/119; 257/126; 257/127; 257/130; 257/133; 257/138

(58) Field of Classification Search
  USPC ........ 257/130, 107, E29.169, 124–127, 133, 257/155, 159, 118, 135, 142, 137, 143, 153, 257/119, 138
  See application file for complete search history.

(56) References Cited

U.S. PATENT DOCUMENTS

| | | |
|---|---|---|
| 3,602,777 A | 8/1971 | Berman |
| 3,603,811 A | 9/1971 | Day et al. |
| 4,281,448 A | 8/1981 | Barry et al. |
| 4,373,252 A | 2/1983 | Caldwell |

(Continued)

FOREIGN PATENT DOCUMENTS

| | | |
|---|---|---|
| EP | 0322400 A2 | 6/1989 |
| EP | 0 807 979 A2 | 11/1997 |

(Continued)

OTHER PUBLICATIONS

Office Action from U.S. Appl. No. 12/238,308 dated Mar. 3, 2011.

(Continued)

*Primary Examiner* — Cheung Lee
*Assistant Examiner* — Jeremy Joy
(74) *Attorney, Agent, or Firm* — Wolf, Greenfield & Sacks, P.C.

(57) ABSTRACT

A modified MOSFET structure comprises an integrated field effect rectifier connected between the source and drain of the MOSFET to shunt current during switching of the MOSFET. The integrated FER provides faster switching of the MOSFET due to the absence of injected carriers during switching while also decreasing the level of EMI relative to discrete solutions. The integrated structure of the MOSFET and FER can be fabricated using N-, multi-epitaxial and supertrench technologies, including 0.25 μm technology. Self-aligned processing can be used.

13 Claims, 5 Drawing Sheets

(56) References Cited

U.S. PATENT DOCUMENTS

| | | |
|---|---|---|
| 4,533,970 A | 8/1985 | Brown |
| 4,599,576 A | 7/1986 | Yoshida et al. |
| 4,610,730 A | 9/1986 | Harrington et al. |
| 4,630,084 A * | 12/1986 | Tihanyi .................. 257/342 |
| 4,722,856 A | 2/1988 | Albrecht et al. |
| 4,783,348 A | 11/1988 | Albrecht et al. |
| 4,843,441 A | 6/1989 | Willard |
| 4,903,189 A | 2/1990 | Ngo et al. |
| 4,955,069 A | 9/1990 | Ionescu |
| 4,962,411 A | 10/1990 | Tokura et al. |
| 4,967,243 A | 10/1990 | Baliga et al. |
| 4,969,028 A | 11/1990 | Baliga |
| 4,980,741 A * | 12/1990 | Temple .................. 257/154 |
| 4,982,260 A | 1/1991 | Chang et al. |
| 4,996,581 A | 2/1991 | Hamasaki |
| 5,019,530 A | 5/1991 | Kleinsasser et al. |
| 5,021,861 A | 6/1991 | Baliga |
| 5,070,377 A | 12/1991 | Harada |
| 5,111,253 A | 5/1992 | Korman et al. |
| 5,291,040 A * | 3/1994 | Oppermann et al. ......... 257/133 |
| 5,304,831 A | 4/1994 | Yilmaz et al. |
| 5,381,025 A | 1/1995 | Zommer |
| 5,387,805 A | 2/1995 | Metzler et al. |
| 5,396,085 A | 3/1995 | Baliga |
| 5,410,171 A * | 4/1995 | Tsuzuki et al. ............... 257/337 |
| 5,416,354 A | 5/1995 | Blackstone |
| 5,430,315 A | 7/1995 | Rumennik |
| 5,446,295 A | 8/1995 | Whitney |
| 5,532,502 A | 7/1996 | Seki |
| 5,545,573 A | 8/1996 | Narazaki et al. |
| 5,554,880 A | 9/1996 | Metzler et al. |
| 5,559,355 A | 9/1996 | Yamazaki et al. |
| 5,621,234 A | 4/1997 | Kato |
| 5,629,536 A | 5/1997 | Heminger et al. |
| 5,637,888 A * | 6/1997 | Iwamuro ...................... 257/139 |
| 5,643,809 A | 7/1997 | Lien |
| 5,719,411 A | 2/1998 | Ajit |
| 5,742,463 A | 4/1998 | Harris |
| 5,744,994 A | 4/1998 | Williams |
| 5,747,841 A | 5/1998 | Ludikhuize |
| 5,751,025 A | 5/1998 | Heminger et al. |
| 5,818,084 A * | 10/1998 | Williams et al. ............... 257/329 |
| 5,825,079 A | 10/1998 | Metzler et al. |
| 5,869,380 A | 2/1999 | Chang |
| 5,877,515 A | 3/1999 | Ajit |
| 5,886,383 A | 3/1999 | Kinzer |
| 5,898,982 A | 5/1999 | Metzler et al. |
| 5,929,690 A | 7/1999 | Williams |
| 5,932,922 A | 8/1999 | Metzler et al. |
| 5,956,582 A | 9/1999 | Ayela et al. |
| 6,034,385 A | 3/2000 | Stephani et al. |
| 6,048,788 A | 4/2000 | Huang et al. |
| 6,051,850 A * | 4/2000 | Park .................. 257/133 |
| 6,078,074 A | 6/2000 | Takebuchi et al. |
| 6,097,046 A | 8/2000 | Plumton |
| 6,100,145 A | 8/2000 | Kepler et al. |
| 6,169,300 B1 * | 1/2001 | Fragapane .................. 257/146 |
| 6,172,398 B1 | 1/2001 | Hshieh |
| 6,186,408 B1 | 2/2001 | Rodov et al. |
| 6,225,280 B1 | 5/2001 | Dokter et al. |
| 6,235,601 B1 | 5/2001 | Kim |
| 6,242,324 B1 | 6/2001 | Kub et al. |
| 6,258,634 B1 | 7/2001 | Wang et al. |
| 6,268,758 B1 | 7/2001 | Limmer et al. |
| 6,281,547 B1 | 8/2001 | So et al. |
| 6,313,001 B1 | 11/2001 | Johansson et al. |
| 6,323,091 B1 | 11/2001 | Lee et al. |
| 6,331,455 B1 | 12/2001 | Rodov et al. |
| 6,362,036 B1 | 3/2002 | Chiozzi et al. |
| 6,373,097 B1 | 4/2002 | Werner |
| 6,384,456 B1 | 5/2002 | Tihanyi |
| 6,399,996 B1 | 6/2002 | Chang et al. |
| 6,404,033 B1 | 6/2002 | Chang et al. |
| 6,420,225 B1 | 7/2002 | Chang et al. |
| 6,426,541 B2 | 7/2002 | Chang et al. |
| 6,448,160 B1 | 9/2002 | Chang et al. |
| 6,459,108 B1 | 10/2002 | Bartsch et al. |
| 6,476,442 B1 | 11/2002 | Williams et al. |
| 6,498,367 B1 | 12/2002 | Chang et al. |
| 6,515,330 B1 | 2/2003 | Hurtz et al. |
| 6,537,860 B2 | 3/2003 | Akiyama et al. |
| 6,593,620 B1 * | 7/2003 | Hshieh et al. .................. 257/335 |
| 6,624,030 B2 | 9/2003 | Chang et al. |
| 6,630,698 B1 | 10/2003 | Deboy et al. |
| 6,653,740 B2 | 11/2003 | Kinzer et al. |
| 6,724,039 B1 | 4/2004 | Blanchard |
| 6,743,703 B2 | 6/2004 | Rodov et al. |
| 6,765,264 B1 | 7/2004 | Chang et al. |
| 6,784,489 B1 | 8/2004 | Menegoli |
| 6,828,605 B2 | 12/2004 | Eisele et al. |
| 6,853,036 B1 | 2/2005 | Rodov et al. |
| 6,897,682 B2 | 5/2005 | Nadd |
| 6,956,266 B1 | 10/2005 | Voldman et al. |
| 6,967,374 B1 | 11/2005 | Saito et al. |
| 6,979,861 B2 | 12/2005 | Rodov et al. |
| 6,992,353 B1 | 1/2006 | Wu |
| 7,009,253 B2 | 3/2006 | Rodov et al. |
| 7,087,981 B2 | 8/2006 | Kapels et al. |
| 7,095,113 B2 | 8/2006 | Xiaochun et al. |
| 7,220,319 B2 | 5/2007 | Sago et al. |
| 7,250,668 B2 | 7/2007 | Chang et al. |
| 7,264,999 B2 | 9/2007 | Xiaochun et al. |
| 7,342,389 B1 | 3/2008 | Wu et al. |
| RE40,222 E | 4/2008 | Fragapane |
| 7,482,655 B2 * | 1/2009 | Nadd ............................. 257/341 |
| 7,560,782 B2 * | 7/2009 | Pellizzer et al. .............. 257/378 |
| 7,781,826 B2 | 8/2010 | Mallikararjunaswamy et al. |
| 7,893,489 B2 | 2/2011 | Kobayashi |
| 8,148,748 B2 | 4/2012 | Ankoudinov et al. |
| 2001/0045635 A1 | 11/2001 | Kinzer et al. |
| 2002/0019115 A1 | 2/2002 | Rodov et al. |
| 2002/0024375 A1 | 2/2002 | Asano et al. |
| 2002/0177324 A1 | 11/2002 | Metzler |
| 2003/0025152 A1 | 2/2003 | Werner et al. |
| 2003/0146474 A1 | 8/2003 | Ker et al. |
| 2003/0207538 A1 * | 11/2003 | Hshieh et al. .................. 438/269 |
| 2003/0222290 A1 | 12/2003 | Rodov et al. |
| 2004/0041619 A1 | 3/2004 | Nadd |
| 2005/0029585 A1 * | 2/2005 | He et al. ......................... 257/330 |
| 2005/0116313 A1 * | 6/2005 | Lee et al. ....................... 257/500 |
| 2005/0152080 A1 | 7/2005 | Harris et al. |
| 2005/0189626 A1 | 9/2005 | Xiaochun et al. |
| 2005/0189658 A1 | 9/2005 | Xiaochun et al. |
| 2005/0200384 A1 | 9/2005 | Nadd |
| 2005/0200394 A1 | 9/2005 | Underwood et al. |
| 2005/0231355 A1 | 10/2005 | Hair, III et al. |
| 2005/0243496 A1 | 11/2005 | Harris |
| 2006/0097323 A1 | 5/2006 | Rodov et al. |
| 2006/0098363 A1 | 5/2006 | Hebert et al. |
| 2006/0098364 A1 | 5/2006 | Harris et al. |
| 2006/0098373 A1 | 5/2006 | Hebert et al. |
| 2006/0145260 A1 | 7/2006 | Kim |
| 2006/0158812 A1 | 7/2006 | Harris |
| 2006/0158816 A1 | 7/2006 | Harris et al. |
| 2006/0176638 A1 | 8/2006 | Coates |
| 2006/0244060 A1 | 11/2006 | Kapels et al. |
| 2006/0250736 A1 | 11/2006 | Harris |
| 2006/0285264 A1 | 12/2006 | Harris |
| 2007/0235752 A1 | 10/2007 | Rodov et al. |
| 2007/0246794 A1 | 10/2007 | Chang et al. |
| 2008/0017930 A1 | 1/2008 | Kim et al. |
| 2008/0079035 A1 | 4/2008 | Bobde |
| 2008/0137249 A1 | 6/2008 | Harris |
| 2008/0192394 A1 | 8/2008 | Harris |
| 2008/0265975 A1 | 10/2008 | Takasu et al. |
| 2008/0284383 A1 | 11/2008 | Aas et al. |
| 2009/0026492 A1 | 1/2009 | Chatty et al. |
| 2009/0078962 A1 * | 3/2009 | Ankoudinov et al. ........ 257/130 |
| 2009/0267111 A1 * | 10/2009 | Ankoudinov et al. ........ 257/124 |
| 2010/0163950 A1 * | 7/2010 | Gladish et al. ................. 257/302 |

(56) References Cited

U.S. PATENT DOCUMENTS

FOREIGN PATENT DOCUMENTS

| JP | 04-343260 A | 11/1992 |
|---|---|---|
| JP | 05082534 A | 4/1993 |
| JP | 05175206 A | 7/1993 |
| JP | 06061250 A | 3/1994 |
| JP | 06112149 A | 4/1994 |
| JP | 08-017933 A | 1/1996 |

OTHER PUBLICATIONS

Office Action from U.S. Appl. No. 12/359,094 dated Mar. 3, 2011.
Office Action from U.S. Appl. No. 12/683,425 dated Dec. 27, 2011.
Ankudinov, A. et al, "High injection regime of the super barrier(TM) rectifier," Solid-State Electronics, vol. 51, No. 5, pp. 714-718.
Ankudinov, A. et al. "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.
Ankudinov, A. et al., "Fine Structure of the Inner Electric Field in Semiconductor Laser Diodes Studied by EFM," Phys. Low-Dim. Struct., 3/4, 2001, pp. 9-16.
Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.
Bashirov, A.M. et al., "Switching of thyristors using the dU/dt effect," Radiotekhnika i Elektronika, vol. 14, No. 2, USSR, Feb. 1969, pp. 374-375.
Bixby, B. et al., "Application Considerations for Very High Speed Fast Recovery Power Diodes," IEEE, IAS 1977 Annual, pp. 1023-1027.
Chelnokov, E. et al, "Effect of moving charge carriers in a collector junction of p-n-p-n structure on the switching on process," Radiotekhnika I Elektronika, v 16, USSR, 1971, pp. 1039-1046.
Christiansen, B. "Synchronous Rectification," PCIM, Aug. 1998, pp. 14-21.
Hikin, B. et al., "Reverse Recovery Process with Non-Uniform Lifetime Distribution in the Base of a Diode," IEEE, IAS 1977 Annual, pp. 644-647.
Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.
Kuz'Min, V.A. et al., "P-N-P-N-Structures Turning on at High-Voltage and High-Current Density, " Radiotekhnika I Elektronika, vol. 20, No. 7, USSR, 1975, pp. 1457-1465.
Kuz'Min, V.A. et al., "The turn-on process of p-n-p-n structures at high voltages and a high current density," Radiotekhnika i Elektronika, vol. 20, No. 8, USSR, Aug. 1975, pp. 1710-1714.
Kuz'Min, V.A. et al., "Turn-on of a p-n-p-n structure at a high current density," Radiotekhnika i Elektronika, vol. 18, No. 1, USSR, Jan. 1973, pp. 158-166.
Lorenz, L. et al., "Improved MOSFET, An Important Milestone Toward a New Power MOSFET Generation," PCIM, Sep. 1993, pp. 14-21.
Melnik, Y. et al., "HVPE GaN and AIGaN "Substrates" for Homoepitaxy," Materials Science Forum vols. 164-268, 1998, pp. 1121-1124.
Molibog, N.P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.
Pavlik, V.Y. et al., "The I-V characteristic of a p-n-p-n structure in the 'On' state for high residual voltages," Radiotekhnika i Elektronika, vol. 18, No. 7, USSR, Jul. 1974, pp. 1468-1475.
Rodov, V. et al, "Super barrier rectifier—a new generation of power diode," IEEE Transactions on Industry Applications, vol. 44, No. 1, pp. 234-237.
Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.
Rodov, V.I., "Non-one-dimensional processes in p-n-p-n structures," Poluprovodnikovye Pribory i ikh Primenenie, No. 28, USSR, 1974, pp. 3-22.
Vemulapati, U. et al., "The Concept of a Regenerative Diode", IEEE, 2007, pp. 193-196.
Office Action dated Mar. 3, 2011 from U.S. Appl. No. 12/359,094.
Office Action dated Mar. 3, 2011 from U.S. Appl. No. 12/238,308.
Office Action dated Sep. 16, 2009 from U.S. Appl. No. 12/238,308.
Office Action dated Aug. 9, 2010 from U.S. Appl. No. 12/359,094.
Office Action/Restriction Requirement dated Sep. 16, 2009 from U.S. Appl. No. 12/359,094.
Extended European Search Report dated Jan. 5, 2011 from European Application No. 09813383.8.
International Search Report dated Mar. 10, 2009 from International Application No. PCT/US2009/031885.
Written Opinion of the International Searching Authority dated Mar. 10, 2009 from International Application No. PCT/US2009/031885.
International Search Report dated Dec. 4, 2008 from International Application No. PCT/US2008/077747.
International Search Report dated Aug. 16, 2010 from International Application PCT/US2010/020284.
International Search Report dated Dec. 20, 2010 from International Application PCT/US2010/033451.
International Search Report dated Jun. 19, 2009 from International Application PCT/US2009/041996.
Written Opinion of the International Searching Authority dated Jun. 19, 2009 from International Application PCT/US2009/041996.
Office Action from U.S. Appl. No. 12/773,003 dated Dec. 6, 2012.
U.S. Appl. No. 13/398,591, filed Feb. 16, 2012, Ankoudinov et al.
Office Action from U.S. Appl. No. 12/683,425, dated Jun. 20, 2012.
Office Action from U.S. Appl. No. 13/398,591 dated Jul. 26, 2012.
Office Action from U.S. Appl. No. 12/359,094 dated Aug. 15, 2012.
Extended European Search Report from related European Patent Application No. 09739614.7, dated Nov. 12, 2012.
Notice of Allowance dated Dec. 14, 2012 from U.S. Appl. No. 12/359,094.

* cited by examiner

MOSFET WITH INTEGRATED FIELD EFFECT RECTIFIER

RELATED APPLICATIONS

This application is related to, and claims the benefit of, U.S. patent application Ser. No. 12/238,308, filed Sep. 25, 2008, titled "Adjustable Field Effect Rectifier" and through it U.S. Provisional Patent Application Ser. No. 60/975,467, filed Sep. 26, 2007, as well as U.S. patent application Ser. No. 12/359,094, filed Jan. 23, 2009, entitled "Regenerative Building Block and Diode Bridge Rectifier," and through it U.S. Provisional Patent Application Ser. No. 61/022,968, filed Jan. 23, 2008, and also provisional U.S. patent application Ser. No. 61/048,336, filed Apr. 28, 2008, entitled "MOSFET with Integrated Field Effect Rectifier," all of which have the same inventors as the present application and are incorporated herein by reference in full for all purposes.

FIELD OF THE INVENTION

The present invention relates generally to semiconductor transistors, and more specifically to an integration of a field effect rectifier into a MOSFET structure for improving the performance of the MOSFET, and methods therefor.

BACKGROUND OF THE INVENTION

MOSFETs are commonly used for fast switching in electronic circuits. However, where the load is inductive the switching speed is limited due to the intrinsic body diode problem. When the gate voltage is used to switch MOSFET from ON to OFF state (reverse recovery), the intrinsic p-n junction diode has to conduct current, and will inject carriers into the bulk of device. Until the injected carriers are dissipated, the MOSFET will continue to stay in the ON state. This causes slow switching of MOSFET from ON to OFF state and limits the frequency of the MOSFET operation.

To overcome the slow switching of the body diode an external freewheeling diode is often added between the source and the drain of the MOSFET to prevent the injection of carriers during reverse recovery. However, the addition of the external diode can lead to increased EMI, since the current that was flowing through the MOSFET now has to flow through the external diode and connecting wires. The extra EMI emissions can also limit the switching speed of the MOSFET with freewheeling diode. While the freewheeling diode is typically put as close to MOSFET as possible, the problem of extra EMI remains.

While integrating the P-N junction diode technology into the MOSFET has an initial appeal, this technology has a limited potential to improve the body diode problem, since the body diode is a P-N junction diode integral to MOSFET structure. Similarly, Schottky diode technology is practically incompatible with MOSFET technologies, since it requires specific metallization not well suited for MOSFET manufacturing.

SUMMARY OF THE INVENTION

To overcome the limitations of the prior art, the present invention integrates a Field Effect Rectifier (FER) into a MOSFET to improve the switching characteristics of the MOSFET when coupled to an inductive load, thus improving switching speed without significant adverse effects on EMI.

In the new design, the FER does not replace the body diode, but provides a shunt or a bypass for the current flow around the body diode. The FER technology is compatible with MOSFET technology, permitting substantially conventional processing. Depending upon the implementation, the device of the present invention can be configured for either high voltage operation (e.g., a discrete high power device) or low voltage operation (e.g., in an integrated circuit) by adjustment of, for example, the size and resistivity of the epi, gate size, and so on. Further, unlike P-N junction diodes, the low voltage FER is a majority carrier device and prevents the body diode from injecting minority carriers that slow down the MOSFET operation. The high voltage FER will inject fewer carriers due to a particular one sided carrier injection mechanism (Rodov, Ankoudinov, Ghosh, Sol. St. Electronics 51 (2007) 714-718).

THE FIGURES

FIGS. 1 and 2 show a MOSFET with integrated Field Effect Rectifier in accordance with the invention, where FIG. 1 shows a DMOS structure and FIG. 2 shows a UMOS structure. The current flow between source and drain is controlled by the gate electrode. The current will flow through the FER during switching, once the Gate voltage does not allow the current flow through the MOSFET. The Adjustment area (optional) provides a control of the leakage current.

FIG. 3 shows in graphical form forward voltage drop vs. current for the body diode of a regular MOSFET (red) and a MOSFETR (green) in accordance with the invention. With VG=+5V the RDS,ON per MOSFET occupied area is about the same. Dark blue curve is for MOSFETR and the light blue is for MOSFET.

DETAILED DESCRIPTION OF THE INVENTION

The present invention comprises a new MOSFET structure that has integrated therein a field effect rectifier (hereinafter sometimes referred to as a "MOSFETR"). The field effect rectifier provides the alternative path for the current flow when the gate voltage switches OFF the current flow through MOSFET. The injection of the carriers from P-N junction can be reduced or completely eliminated, leading to faster MOSFET switching without significant EMI.

Figure 1:
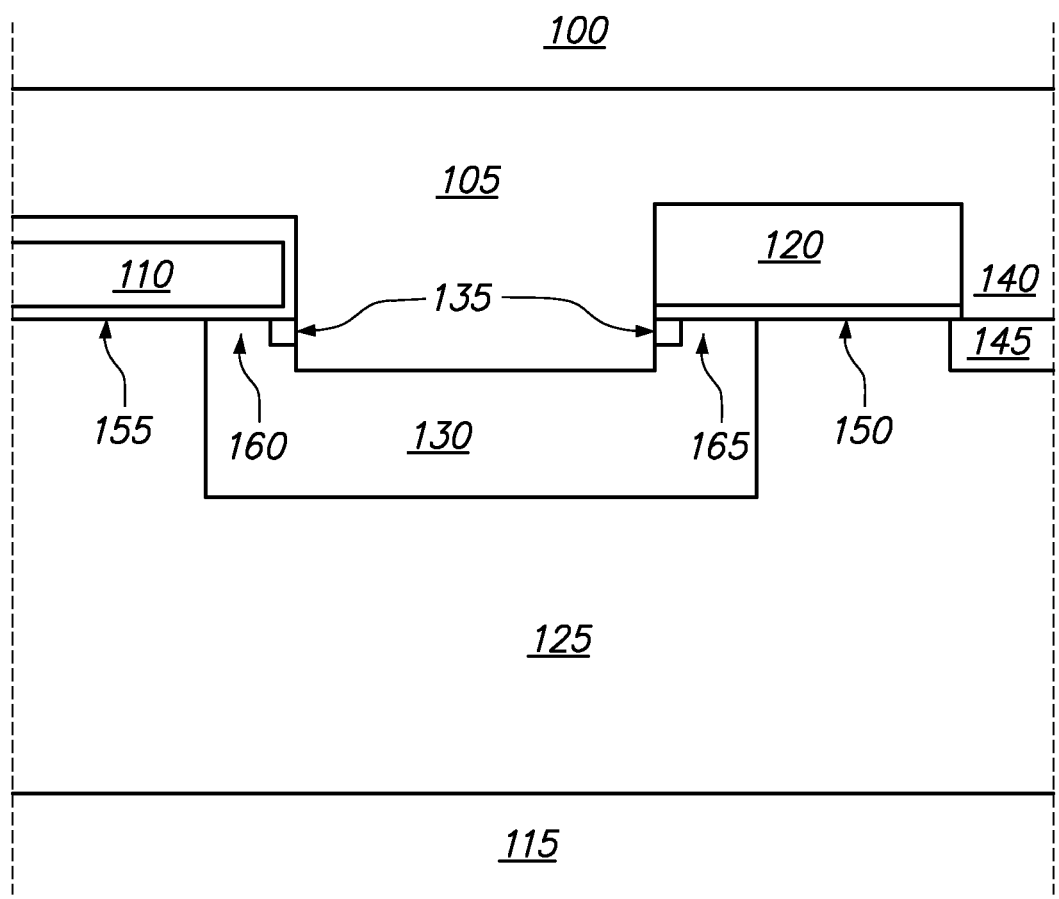

Referring first to FIG. 1, the DMOS MOSFETR structure indicated generally at 100 comprises a MOSFET on the left and an FER on the right. In some embodiments, the FER device can be adjustable as described in U.S. Provisional Patent Application Ser. No. 60/975,467, filed Sep. 26, 2007, although an FER without adjustable area also can be used in other embodiments. As shown in FIG. 1, the MOSFETR 100 has three electrodes: source 105, gate 110 and drain 115. The main current flows between the source 105 and drain 115 electrodes through the epitaxial N-layer 125. The p-type body region 130 is provided to create a depletion layer when reverse bias is applied. The N++ source regions 135 provide ohmic contact for the current flow. The adjustment area comprises the window 140 inside the FER gate and the P++ implantation 145. The adjustment area permits control of the current flow, and thus can be desirable in some embodiments, depending upon the implementation. The gate oxide thickness and the doping levels control the height of the potential barrier under the FER gate 120, and therefore the gate oxide 150 under FER gate 120 can, in some embodiments, have a different thickness than the gate oxide 155 under the MOSFET gate 110. The gate voltage controls the conductivity of the narrow channel 160 under MOS gate 110 and switches the MOSFET between OFF and ON states. The transition from ON to OFF happens at the threshold voltage, which can be adjusted either by using a doping profile under the gate or by changing the thickness of the gate oxide 155. The gate oxide thickness for the sides of MOSFET gate 110 and FER gate 120 can be varied independently of one another to ensure proper operation of both components.

Figure 2:
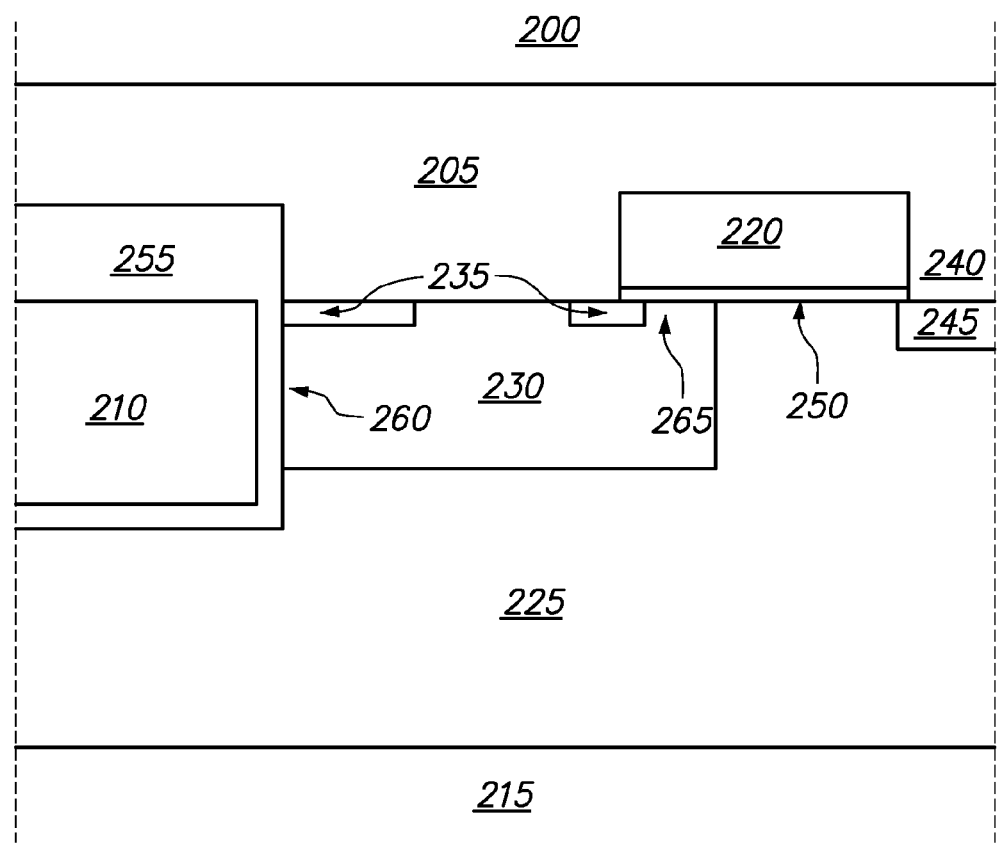
Figure 3:
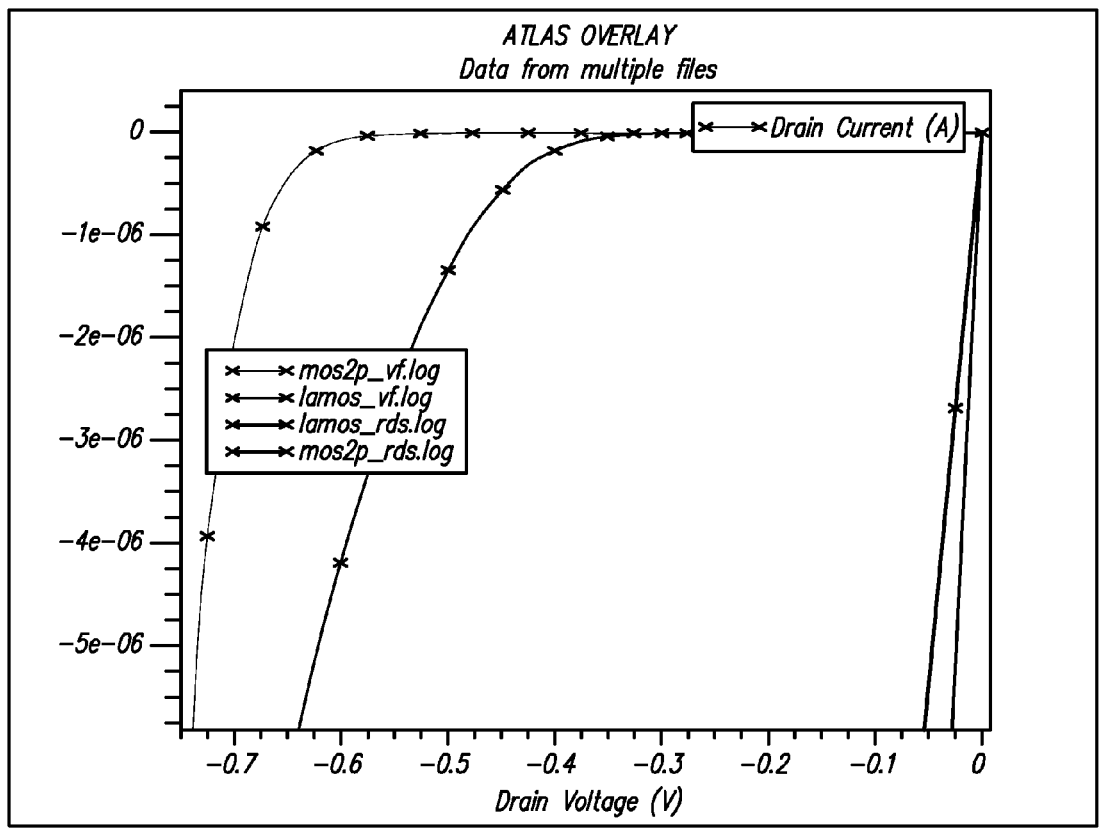

When the MOSFETR 100 is in the ON state (e.g., VGS=+5V), current flows through MOSFET channel 160. A forward characteristic of an embodiment of MOSFETR in accordance with the invention is shown in FIG. 2, where the device is capable of operating at 10 A at 20V. It can be appreciated by those skilled in the art that the MOSFETR has RDS,ON equal to 3.6 milliohm. If the right portion of the device is also a MOSFET, then simulated RDS,On is 2.0 milliohm. Notice that, for the characteristics shown in FIG. 2, the area of the MOSFET is on the order of 50% of the total area of the MOSFETR. Thus RDS,On of MOSFETR per unit area is about 10% smaller. This results because part of the epitaxial layer under the diode is used for conduction during MOSFET operation. It will be appreciated that this effect will, for some embodiments, increase for higher voltage devices. The increase of RDS,ON is typically smaller for high voltage devices, since the epitaxial layer becomes thicker to withstand higher reverse voltage. For some embodiments the area covered by MOSFET can be increased to reduce RDS,On, while the reduced FER area is still effective for the stored charge reduction.

FIG. 2 shows a UMOS MOSFETR structure which operates in a manner substantially identical with that shown in FIG. 1, and like elements are shown with like reference numbers, but with the most significant digit incremented by one.

When the MOSFET is turned OFF (VGS=−5V), the current will flow through the body diode of MOSFET with VF=0.76V or through the FER of the MOSFETR with VF=0.58. In at least some embodiments, VF will preferably be kept below the knee voltage (~0.7V) of the body diode, where P-N junction starts to inject carriers. Thus, a conventional MOSFET will inject carriers during switching while a MOSFETR according to the present invention substantially eliminates this undesirable behavior.

Figure 4:
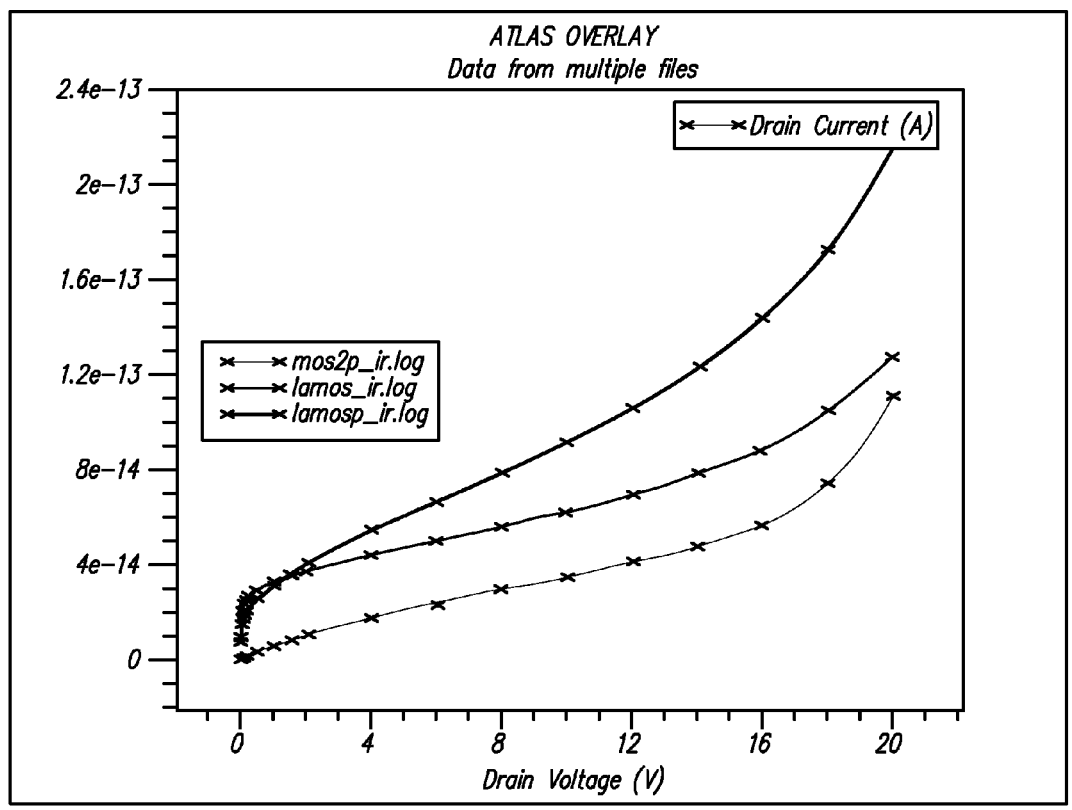
FIG. 4 shows leakage current vs. reverse voltage for a conventional MOSFET (red), and MOSFETR with (green) and without (blue) the adjustment area in accordance with the invention. Scale (1 A=2.5e-7)

In the OFF state, a small leakage current will flow through the AFER channel 165. In at least some embodiments, this leakage is controlled by the potential barrier height and how fast the pinch-off effect takes place. FIG. 4 demonstrates that the leakage of a MOSFETR is about 500 microAmperes at 20V, which is similar to the leakage of a MOSFET. The adjustment area of the MOSFETR plays a role to keep leakage under control, and the leakage of a MOSFETR that does not have adjustment area is on the order of twice as much, or 1 milliAmpere. At higher voltages, the effect of the adjustment area can decrease.

FIG. 4 illustrates the absence of injected carriers during switching with inductive load. For the example of FIG. 4, VGS is set to −5V, which turns OFF the current through MOSFET channel. The electron density distribution in MOSFETR for a 10 A forward current is substantially the same as the electron density distribution with no current, and thus confirms that no carrier density modulation occurs. The electron concentration in the middle of the epitaxial N-layer can be seen to be on the order of 2.9e16. In contrast, operation of a conventional MOSFET shows significant injection at 10 A current: the electron concentration becomes 5.1e16, or almost double. These injected carriers significantly slow down the operation of a conventional MOSFET with inductive loads.

Figure 5:
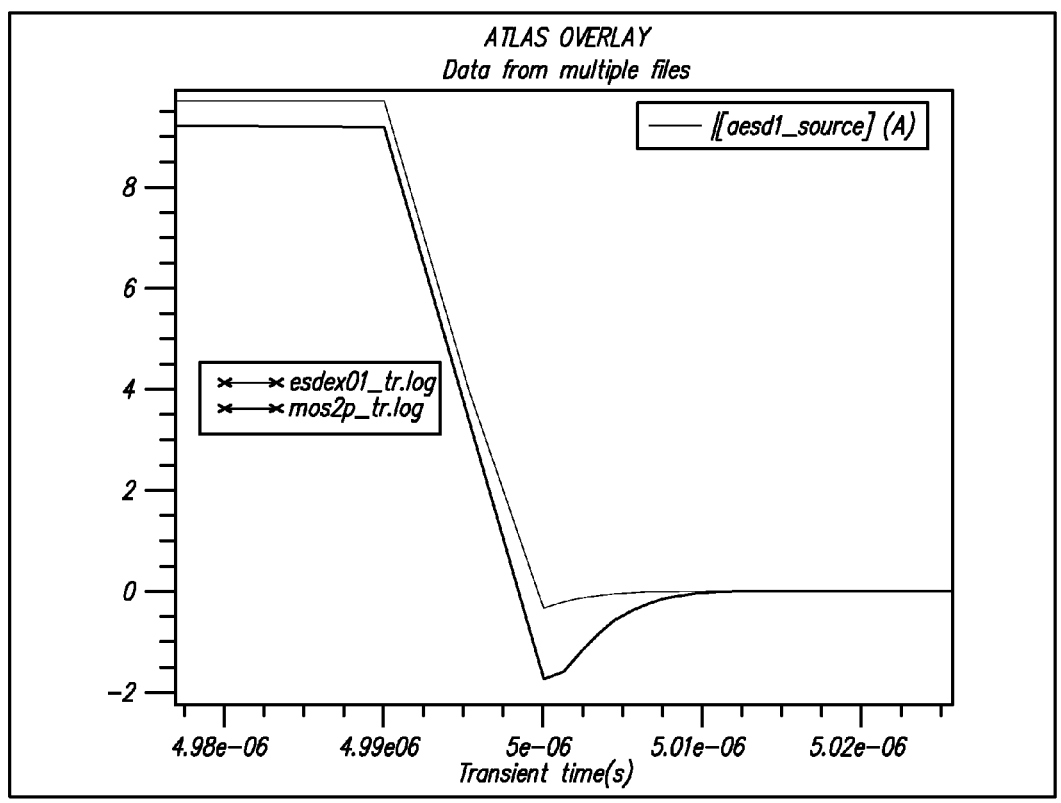
FIG. 5 illustrates transients for a 10 A 20V MOSFETR according to the invention.

FIG. 5 shows the simulated transient behavior of MOSFET with and without the integrated diode. The transient time and stored charge are significantly smaller for MOSFETR. The low stored charge and small dI/dt of MOSFETR demonstrate that the device of the present invention is highly suitable for fast switching applications.

In summary, the static characteristics of MOSFETR are very similar to those of the regular MOSFET, while exhibiting faster switching due to the absence of injected carriers during switching. The integrated FER diode structure is preferred over the discrete solution since it will decrease the level of EMI and allow the faster switching with low EMI.

While the embodiment of the invention described is based on an N-epitaxial layer, it will be appreciated by those skilled in the art that equivalent structures can be formed using multi-epitaxial or supertrench methods, and it is specifically intended that the present invention encompass such alternatives. Likewise, it will be appreciated that the present structure is typically integrated into the larger circuits, and can be fabricated using standard methods including, for example, 0.25 μm technology with a mask alignment accuracy of approximately 20 nm, as well as others.

The present invention has been described in detail, including numerous alternatives and equivalents. It is therefore to be understood that the invention is not to be limited by the embodiments specifically described herein, but only by the appended claims.

We claim:

1. An apparatus comprising:
   a metal oxide semiconductor field effect transistor (MOSFET) having a first gate, a source, a drain, and a first gate oxide, wherein the current flow between the source and the drain is controlled by the voltage applied to the first gate; and
   a field effect rectifier connected between the source and the drain and serving to shunt current therethrough during switching of the MOSFET, the field effect rectifier comprising a second gate and a second gate oxide,
   wherein a first gate oxide of the MOSFET and the second gate oxide of the field effect rectifier have different thicknesses.

2. The apparatus of claim 1 wherein the MOSFET is a DMOS structure.

3. The apparatus of claim 1 where the MOSFET is a UMOS structure.

4. The apparatus of claim 1 formed using a self-aligned process.

5. The apparatus of claim 1 formed using not greater than 0.25 μm processing.

6. The apparatus of claim 1 formed using N-epitaxial processing.

7. The apparatus of claim 1 formed using multi-epitaxial processing.

8. The apparatus of claim 1 formed using supertrench processing.

9. A semiconductor structure comprising:
   a DMOS-type transistor;
   a field effect rectifier formed in the same substrate as said transistor and connected to shunt shunt current away from a body diode of the DMOS-type transistor, the field effect rectifier comprising a second gate, a second gate oxide, a drift region, and a p-type adjustment region within said drift region, wherein the first gate oxide of the DMOS-type transistor and the second gate oxide of the field effect rectifier have different thicknesses.

10. The structure of claim 9, wherein said source is n-type, and is surrounded by a p-type body region.

11. The structure of claim 9, wherein said field effect rectifier has a respective gate electrode which is formed from the same thin film layer as said gate of said transistor.

12. The structure of claim 9, wherein said transistor and said field effect rectifier both comprise MOS gate structures, but have different respective gate dielectric thicknesses.

13. The structure of claim 9, wherein said drain is n-type.

* * * * *